United States Patent
Yudovsky et al.

(10) Patent No.: US 10,273,578 B2
(45) Date of Patent: Apr. 30, 2019

(54) TOP LAMP MODULE FOR CAROUSEL DEPOSITION CHAMBER

(71) Applicant: Applied Materials, Inc., Santa Clara, CA (US)

(72) Inventors: Joseph Yudovsky, Campbell, CA (US); Robert T. Trujillo, San Jose, CA (US); Kevin Griffin, Livermore, CA (US); Garry K. Kwong, San Jose, CA (US); Kallol Bera, San Jose, CA (US); Li-Qun Xia, Cupertino, CA (US); Mandyam Sriram, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 793 days.

(21) Appl. No.: 14/506,317

(22) Filed: Oct. 3, 2014

(65) Prior Publication Data
US 2016/0097122 A1    Apr. 7, 2016

(51) Int. Cl.
*C23C 16/455*  (2006.01)
*C23C 16/46*   (2006.01)
*C23C 16/458*  (2006.01)

(52) U.S. Cl.
CPC .... *C23C 16/45544* (2013.01); *C23C 16/4557* (2013.01); *C23C 16/4584* (2013.01); *C23C 16/45551* (2013.01); *C23C 16/45565* (2013.01); *C23C 16/45574* (2013.01); *C23C 16/45578* (2013.01); *C23C 16/46* (2013.01)

(58) Field of Classification Search
CPC ........ C23C 16/45544; C23C 16/45565; C23C 16/45551; C23C 16/45578; C23C 16/46; C23C 16/4584; C23C 16/4557; C23C 16/45574

USPC .......................................... 118/715, 724, 725
See application file for complete search history.

(56) References Cited

U.S. PATENT DOCUMENTS

| | | | | |
|---|---|---|---|---|
| 4,832,777 | A * | 5/1989 | Davis | H01L 21/67115 118/725 |
| 5,186,718 | A | 2/1993 | Tepman et al. | |
| 6,258,731 | B1 * | 7/2001 | Ando | C23C 8/10 257/E21.285 |
| 6,289,842 | B1 * | 9/2001 | Tompa | C23C 16/4411 118/715 |
| 9,617,640 | B2 * | 4/2017 | Yudovsky | C23C 16/45551 |
| 9,765,434 | B2 * | 9/2017 | Yudovsky | C23C 16/52 |
| 2003/0047282 | A1 * | 3/2003 | Sago | C23C 16/45565 156/345.34 |

(Continued)

FOREIGN PATENT DOCUMENTS

WO    2014/130670 A1    8/2014

OTHER PUBLICATIONS

PCT International Search Report and Written Opinion in PCT/US2015/053535, dated Jan. 13, 2016, 13 pages.

*Primary Examiner* — Jeffrie R Lund
(74) *Attorney, Agent, or Firm* — Servilla Whitney LLC

(57) ABSTRACT

A heating module for use in a substrate processing chamber. The heating module having a housing with a heat source therein. The heating module can be part of a gas distribution assembly positioned above a susceptor assembly to heat the top surface of the susceptor and wafers directly. The heating module can have constant or variable power output. Processing chambers and methods of processing a wafer using the heating module are described.

17 Claims, 9 Drawing Sheets

(56) References Cited

U.S. PATENT DOCUMENTS

| | | | | |
|---|---|---|---|---|
| 2003/0159307 A1* | 8/2003 | Sago | H01L 21/67017 | 34/107 |
| 2003/0194493 A1* | 10/2003 | Chang | C23C 16/45512 | 427/248.1 |
| 2004/0058293 A1* | 3/2004 | Nguyen | C23C 16/45525 | 432/129 |
| 2004/0067641 A1* | 4/2004 | Yudovsky | C23C 16/4412 | 438/680 |
| 2006/0130761 A1* | 6/2006 | Sakai | C23C 16/45523 | 118/719 |
| 2007/0215036 A1* | 9/2007 | Park | C23C 16/45551 | 117/88 |
| 2008/0102207 A1* | 5/2008 | Tsai | C23C 16/45565 | 427/255.28 |
| 2008/0156440 A1* | 7/2008 | Sago | C23C 16/45565 | 156/345.34 |
| 2008/0199614 A1* | 8/2008 | Li | C23C 16/45544 | 427/255.34 |
| 2009/0098276 A1* | 4/2009 | Burrows | C23C 16/45565 | 427/8 |
| 2009/0148704 A1* | 6/2009 | Takasuka | C23C 16/4401 | 428/411.1 |
| 2009/0223441 A1* | 9/2009 | Arena | C23C 16/303 | 117/88 |
| 2009/0275210 A1* | 11/2009 | Shanker | C23C 16/04 | 438/761 |
| 2011/0277681 A1* | 11/2011 | Arena | C23C 16/34 | 117/88 |
| 2012/0222616 A1* | 9/2012 | Han | C23C 16/4401 | 118/723 E |
| 2012/0225192 A1* | 9/2012 | Yudovsky | C23C 16/45527 | 427/58 |
| 2012/0225195 A1* | 9/2012 | Yudovsky | C23C 16/45551 | 427/58 |
| 2012/0225207 A1* | 9/2012 | Yudovsky | C23C 16/45551 | 427/255.5 |
| 2012/0225219 A1* | 9/2012 | Yudovsky | C23C 16/45551 | 427/595 |
| 2012/0225566 A1* | 9/2012 | Hamano | C23C 16/46 | 438/765 |
| 2012/0312231 A1* | 12/2012 | Li | C23C 16/303 | 118/715 |
| 2013/0137267 A1* | 5/2013 | Chang | H01J 37/3244 | 438/694 |
| 2013/0143415 A1* | 6/2013 | Yudovsky | C23C 16/45551 | 438/765 |
| 2013/0192761 A1* | 8/2013 | Yudovsky | C23C 16/54 | 156/345.55 |
| 2013/0196078 A1* | 8/2013 | Yudovsky | C23C 16/4584 | 427/535 |
| 2013/0210238 A1* | 8/2013 | Yudovsky | H01L 21/02104 | 438/758 |
| 2013/0269613 A1* | 10/2013 | Sanchez | H01L 21/02104 | 118/724 |
| 2013/0344688 A1* | 12/2013 | Ye | H01L 21/02636 | 438/486 |
| 2014/0023794 A1* | 1/2014 | Mahajani | C23C 16/325 | 427/535 |
| 2014/0027060 A1* | 1/2014 | Ranish | B05B 13/00 | 156/345.33 |
| 2014/0087488 A1* | 3/2014 | Nam | H01J 37/32091 | 438/5 |
| 2014/0127404 A1* | 5/2014 | Yudovsky | C23C 16/4412 | 427/248.1 |
| 2015/0147889 A1* | 5/2015 | Yudovsky | H01L 21/0228 | 438/758 |
| 2015/0200110 A1* | 7/2015 | Li | H01L 21/31144 | 438/696 |
| 2015/0299855 A1* | 10/2015 | Yudovsky | C23C 16/52 | 427/8 |
| 2015/0345022 A1* | 12/2015 | Yudovsky | C23C 16/45551 | 438/14 |
| 2015/0380221 A1* | 12/2015 | Liu | C23C 16/45536 | 427/569 |
| 2016/0002784 A1* | 1/2016 | Omstead | C23C 16/45536 | 427/523 |
| 2016/0024653 A1* | 1/2016 | Forster | H01J 37/321 | 427/569 |
| 2016/0027674 A1* | 1/2016 | Griffin | C23C 16/52 | 438/16 |
| 2016/0027675 A1* | 1/2016 | Ravid | H01L 21/67259 | 118/713 |
| 2016/0056032 A1* | 2/2016 | Baldasseroni | H01L 21/0228 | 438/778 |
| 2016/0068953 A1* | 3/2016 | Li | C23C 16/4412 | 118/712 |
| 2016/0097122 A1* | 4/2016 | Yudovsky | C23C 16/45544 | 118/725 |
| 2016/0215392 A1* | 7/2016 | Yudovsky | C23C 16/45551 | |
| 2016/0215396 A1* | 7/2016 | Khandelwal | C23C 16/52 | |
| 2016/0369398 A1* | 12/2016 | Yudovsky | C23C 16/45502 | |
| 2017/0051407 A1* | 2/2017 | Kwong | C23C 16/46 | |
| 2017/0076917 A1* | 3/2017 | Yudovsky | H01J 37/32651 | |
| 2017/0370001 A1* | 12/2017 | Yudovsky | C23C 16/52 | |

* cited by examiner

TOP LAMP MODULE FOR CAROUSEL DEPOSITION CHAMBER

BACKGROUND

Embodiments of the invention generally relate to an apparatus for processing substrates. More particularly, the invention relates to a batch processing platform for performing atomic layer deposition (ALD) and chemical vapor deposition (CVD) on substrates using a top-mounted heat source.

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for ALD processes and some chemical vapor deposition (CVD) processes.

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, it may be necessary to use an ALD process. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form an uniform material layer on the surface of a substrate. Cycles of reactive precursor and inert purge gases are repeated to form the material layer to a predetermined thickness.

Current carousel processing chambers used for high throughput ALD processing incorporate a stationary heater positioned below a spinning susceptor. At high temperature, the heater source loses about 19 kW of energy from the susceptor to the cooler injector. This loss in power prevents current architectures from reaching wafer processing temperature of 650 C. There is a need for apparatus and methods to accurately and repeatedly heating the process chamber to the a predetermined temperature.

SUMMARY

Embodiments of the invention are directed to processing chamber comprising a circular gas distribution assembly and a susceptor assembly. The circular gas distribution assembly is positioned within the processing chamber and comprises a plurality of elongate gas ports in a front face of the gas distribution assembly. The plurality of elongate gas ports extend from at least an inner diameter region to an outer diameter region of the gas distribution assembly. The plurality of gas ports comprise a reactive gas port to deliver a reactive gas to the processing chamber, a purge gas port to deliver a purge gas to the processing chamber and a vacuum port to evacuate gases from the processing chamber. A heating module comprising a heat source is within the circular gas distribution assembly. The heating module has a wedge shape and the heat source comprises one or more of a lamp or resistive heater. A susceptor assembly is within the processing chamber to rotate at least one substrate in a substantially circular path about a rotational axis. The susceptor assembly has a top surface defined by an inner peripheral edge and an outer peripheral edge. The susceptor assembly is positioned between the gas distribution assembly so that the top surface of the susceptor assembly faces the front face of the gas distribution assembly.

Additional embodiments of the invention are directed to processing chambers comprising a slit valve, a circular gas distribution assembly and a susceptor assembly. The slit valve isolates an interior region of the processing chamber. The circular gas distribution assembly comprises a plurality of elongate wedge shaped gas ports extending at least from an inner diameter region to an outer diameter region of the gas distribution assembly. The plurality of elongate wedge shaped gas ports comprises at least one reactive gas port to deliver at least one reactive gas to the processing chamber. At least one purge gas port delivers a purge gas to the processing chamber and at least one vacuum port evacuates gases from the processing chamber. A wedge shaped heating module comprising a heat source is located within the circular gas distribution assembly adjacent to the slit valve. The heat source comprises one or more of a lamp or a resistive heater. The susceptor assembly is within the processing chamber to rotate at least one substrate in a substantially circular path about a rotational axis. The susceptor assembly has a top surface defined by an inner peripheral edge and an outer peripheral edge. The susceptor assembly is positioned below the gas distribution assembly so that the top surface of the susceptor assembly faces the front face of the gas distribution assembly. A heater is located beneath the susceptor assembly to heat the susceptor assembly. The heater comprises one or more of a lamp or a resistive heater.

Further embodiments of the invention are directed to processing chambers comprising a circular gas distribution assembly, a susceptor assembly and a heater. The circular gas distribution assembly is positioned within the processing chamber and comprises a plurality of elongate wedge shaped gas ports in a front face of the gas distribution assembly. The plurality of elongate wedge shaped gas ports extend at least from an inner diameter region to an outer diameter region of the gas distribution assembly. The plurality of elongate wedge shaped gas ports comprise at least one reactive gas port to deliver at least one reactive gas to the processing chamber, at least one purge gas port to deliver a purge gas to the processing chamber, at least one vacuum port to evacuate gases from the processing chamber, and at least one wedge shaped heating module comprising at least one lamp. The susceptor assembly is within the processing chamber to rotate at least one substrate in a substantially circular path about a rotational axis. The susceptor assembly has a top surface defined by an inner peripheral edge and an outer peripheral edge. The susceptor assembly is positioned below the gas distribution assembly so that the top surface of the susceptor assembly faces the front face of the gas distribution assembly. The heater is located beneath the susceptor assembly to heat the susceptor assembly. The heater comprises one or more of a lamp or a resistive heater.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide a substrate processing system for continuous substrate deposition to maximize throughput and improve processing efficiency and uniformity. The substrate processing system can also be used for pre-deposition and post-deposition substrate treatments. Embodiments of the invention are related to apparatus and methods for increasing deposition uniformity in a batch processor.

Embodiments of the invention incorporate a top heater in addition to, or in place of, the heater positioned beneath the susceptor assembly. The inventors have found that incorporating the top heater allows for increases in the temperature of the wafer, allows for the heating of process gases to introduction to the chamber and allows for the pre-heating of the wafer before landing on the susceptor. Some embodiments of the invention provide a radiant heat source inside of a heat sinking injector plate. Some embodiments have a radiant lamp module comprising a single or plurality of lamps that emit radiant energy back to the susceptor.

In some embodiments, the lamp module is positioned above or adjacent to the slid valve segment. The power to the lamp module can be disengaged when a processed wafer is taken from the chamber and can be engaged when an unprocessed wafer is entering the chamber. The lamp module can be engaged when the wafer is on the blade, when the wafer is on the lift pins in proximity to the susceptor surface. In some embodiments, the wafer is heated on the pins so that when it contacts the susceptor surface there is little or no thermal shock.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. For example, in spatially separated ALD, described with respect to FIG. 1, each precursor is delivered to the substrate, but any individual precursor stream, at any given time, is only delivered to a portion of the substrate. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive in an atomic layer deposition process. For example, a first "reactive gas" may simply adsorb onto the surface of a substrate and be available for further chemical reaction with a second reactive gas.

Figure 1:
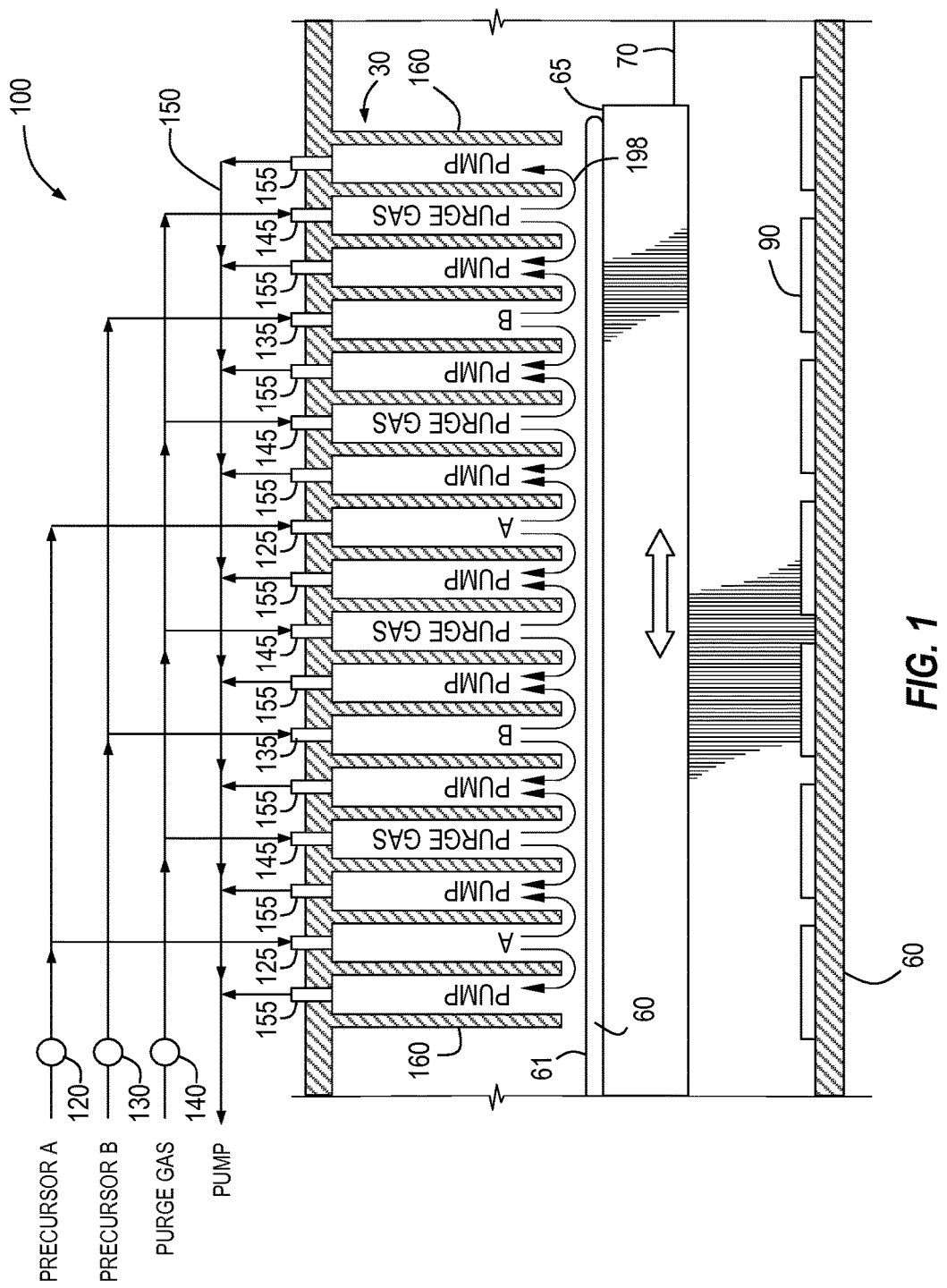
FIG. 1 is a cross-sectional side view of a spatial atomic layer deposition chamber in accordance with one or more embodiment of the invention.

FIG. 1 is a schematic cross-sectional view of a portion of a processing chamber 20 in accordance with one or more embodiments of the invention. The processing chamber 20 is generally a sealable enclosure, which is operated under vacuum, or at least low pressure conditions. The processing chamber 100 includes a gas distribution assembly 30 capable of distributing one or more gases across the top surface 61 of a substrate 60. The gas distribution assembly 30 can be any suitable assembly known to those skilled in the art, and specific gas distribution assemblies described should not be taken as limiting the scope of the invention. The output face of the gas distribution assembly 30 faces the first surface 61 of the substrate 60.

Substrates for use with the embodiments of the invention can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire and silicon carbide.

The gas distribution assembly 30 comprises a plurality of gas ports to transmit one or more gas streams to the substrate 60 and a plurality of vacuum ports disposed between each gas port to transmit the gas streams out of the processing chamber 20. In the embodiment of FIG. 1, the gas distribution assembly 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 injects a continuous (or pulse) stream of a reactive precursor of compound A into the processing chamber 20 through a plurality of gas ports 125. The precursor injector 130 injects a continuous (or pulse) stream of a reactive precursor of compound B into the processing chamber 20 through a plurality of gas ports 135. The purge gas injector 140 injects a continuous (or pulse) stream of a non-reactive or purge gas into the processing chamber 20 through a plurality of gas ports 145. The purge gas removes reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, thereby avoiding cross-contamination between the precursors.

In another aspect, a remote plasma source (not shown) may be connected to the precursor injector 120 and the precursor injector 130 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high energy light source (e.g., UV energy), or exposure to an x-ray source. Exemplary remote plasma sources are available from vendors such as MKS Instruments, Inc. and Advanced Energy Industries, Inc.

The processing chamber 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The processing chamber 100 includes a plurality of partitions 160 disposed on the processing chamber 20 between each port. A lower portion of each partition extends close to the first surface 61 of substrate 60, for example, about 0.5 mm or greater from the first surface 61. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the invention. It will be understood by those skilled in the art that the gas distribution system shown is merely one possible distribution system and the other types of showerheads and gas distribution assemblies may be employed.

Figure 3:
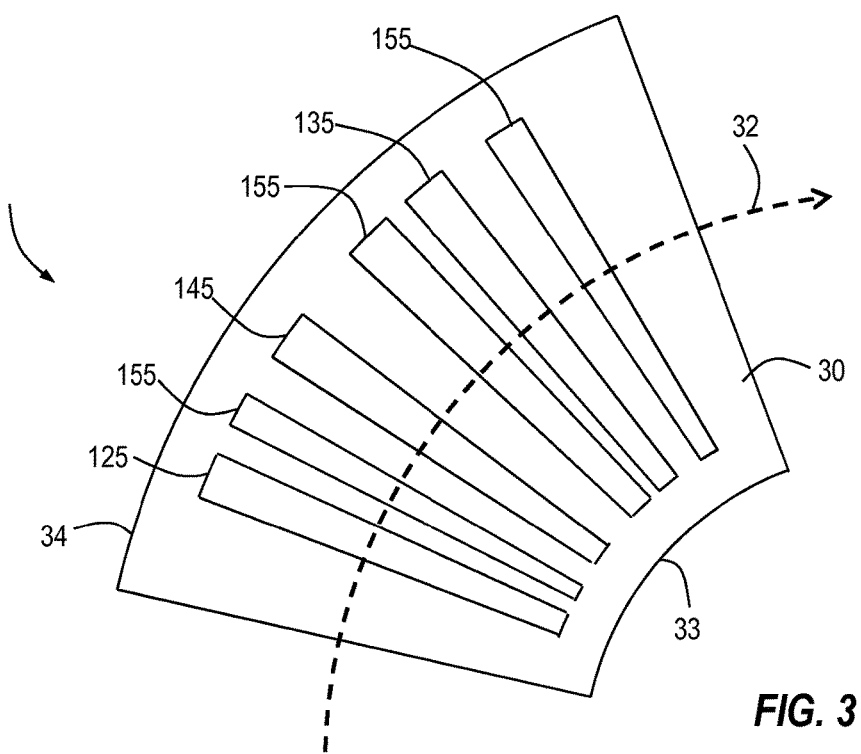
FIG. 3 shows a schematic of a pie-shaped gas distribution assembly in accordance with one or more embodiments of the invention.

Atomic layer deposition systems of this sort (i.e., where multiple gases are separately flowed toward the substrate at the same time) are referred to as spatial ALD. In operation, a substrate 60 is delivered (e.g., by a robot) to the processing chamber 20 and can be placed on a shuttle 65 before or after entry into the processing chamber. The shuttle 65 is moved along the track 70, or some other suitable movement mechanism, through the processing chamber 20, passing beneath (or above) the gas distribution assembly 30. In the embodiment shown in FIG. 1, the shuttle 65 is moved in a linear path through the chamber. FIG. 3, as explained further below, shows an embodiment in which wafers are moved in a circular path through a carousel processing system.

Referring back to FIG. 1, as the substrate 60 moves through the processing chamber 20, the first surface 61 of substrate 60 is repeatedly exposed to the reactive gas A coming from gas ports 125 and reactive gas B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the reactive gases or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the substrate surface 110 and around the lower portions of the partitions 160, and finally upward toward the vacuum ports 155. In this manner, each gas may be uniformly distributed across the substrate surface 110. Arrows 198 indicate the direction of the gas flow. Substrate 60 may also be rotated while being exposed to the various gas streams. Rotation of the substrate may be useful in preventing the formation of strips in the formed layers. Rotation of the substrate can be continuous or in discrete steps and can occur while the substrate is passing beneath the gas distribution assembly 30 or when the substrate is in a region before and/or after the gas distribution assembly 30.

Sufficient space is generally provided after the gas distribution assembly 30 to ensure complete exposure to the last gas port. Once the substrate 60 has completely passed beneath the gas distribution assembly 30, the first surface 61 has completely been exposed to every gas port in the processing chamber 20. The substrate can then be transported back in the opposite direction or forward. If the substrate 60 moves in the opposite direction, the substrate surface may be exposed again to the reactive gas A, the purge gas, and reactive gas B, in reverse order from the first exposure.

The extent to which the substrate surface 110 is exposed to each gas may be determined by, for example, the flow rates of each gas coming out of the gas port and the rate of movement of the substrate 60. In one embodiment, the flow rates of each gas are controlled so as not to remove adsorbed precursors from the substrate surface 61. The width between each partition, the number of gas ports disposed on the processing chamber 20, and the number of times the substrate is passed across the gas distribution assembly may also determine the extent to which the substrate surface 61 is exposed to the various gases. Consequently, the quantity and quality of a deposited film may be optimized by varying the above-referenced factors.

Although description of the process has been made with the gas distribution assembly 30 directing a flow of gas downward toward a substrate positioned below the gas distribution assembly, it will be understood that this orientation can be different. In some embodiments, the gas distribution assembly 30 directs a flow of gas upward toward a substrate surface. As used in this specification and the appended claims, the term "passed across" means that the substrate has been moved from one side of the gas distribution assembly to the other side so that the entire surface of the substrate is exposed to each gas stream from the gas distribution plate. Absent additional description, the term "passed across" does not imply any particular orientation of gas distribution assemblies, gas flows or substrate positions.

In some embodiments, the shuttle 65 is a susceptor 66 for carrying the substrate 60. Generally, the susceptor 66 is a carrier which helps to form a uniform temperature across the substrate. The susceptor 66 is movable in both directions (left-to-right and right-to-left, relative to the arrangement of FIG. 1) or in a circular direction (relative to FIG. 3). The susceptor 66 has a top surface 67 for carrying the substrate 60. The susceptor 66 may be a heated susceptor so that the substrate 60 may be heated for processing. As an example, the susceptor 66 may be heated by radiant heat lamps 90, a heating plate, resistive coils, or other heating devices, disposed underneath the susceptor 66.

Figure 2:
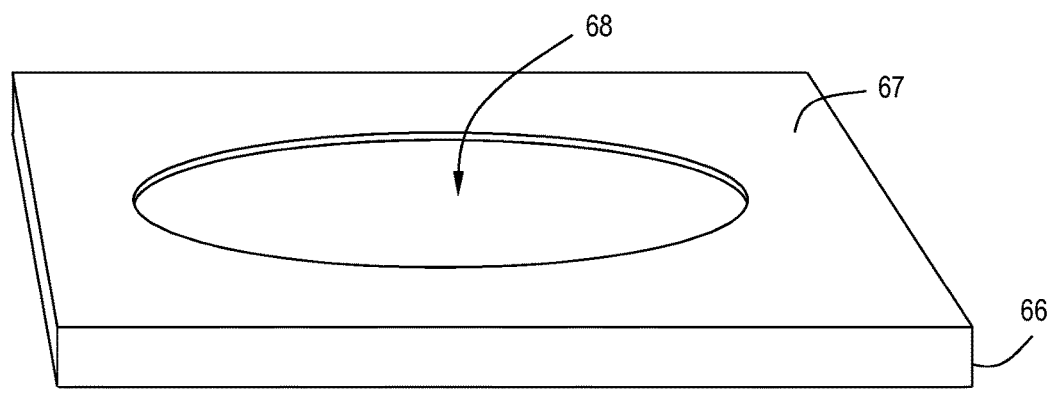
FIG. 2 shows a perspective view of a susceptor in accordance with one or more embodiments of the invention.

In still another embodiment, the top surface 67 of the susceptor 66 includes a recess 68 to accept the substrate 60, as shown in FIG. 2. The susceptor 66 is generally thicker than the thickness of the substrate so that there is susceptor material beneath the substrate. In some embodiments, the recess 68 is sized such that when the substrate 60 is disposed inside the recess 68, the first surface 61 of substrate 60 is level with, or substantially coplanar with, the top surface 67 of the susceptor 66. Stated differently, the recess 68 of some embodiments is sized such that when a substrate 60 is disposed therein, the first surface 61 of the substrate 60 does not protrude above the top surface 67 of the susceptor 66. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

FIG. 1 shows a cross-sectional view of a processing chamber in which the individual gas ports are shown. This embodiment can be either a linear processing system in which the width of the individual gas ports is substantially the same across the entire width of the gas distribution plate, or a pie-shaped segment in which the individual gas ports change width to conform to the pie shape. FIG. 3 shows a portion of a pie-shaped gas distribution assembly 30. A substrate would be passed across this gas distribution assembly 30 in an arc shape path 32. Each of the individual gas ports 125, 135, 145, 155 have a narrower width near the inner peripheral edge 33 of the gas distribution assembly 30a and a larger width near the outer peripheral edge 34 of the gas distribution assembly 30. The shape or aspect ratio of the individual ports can be proportional to, or different from, the shape or aspect ratio of the gas distribution assembly 30 segment. In some embodiments, the individual ports are shaped so that each point of a wafer passing across the gas distribution assembly 30 following path 32 would have about the same residence time under each gas port. The path of the substrates can be perpendicular to the gas ports. In some embodiments, each of the gas distribution assemblies comprises a plurality of elongate gas ports which extend in a direction substantially perpendicular to the path traversed by a substrate. As used in this specification and the appended claims, the term "substantially perpendicular" means that the general direction of movement is approximately perpendicular to the axis of the gas ports. For a pie-shaped gas port, the axis of the gas port can be considered to be a line defined as the mid-point of the width of the port extending along the length of the port. As described further below, each of the individual pie-shaped segments can be configured to deliver a single reactive gas or multiple reactive gases separated spatially or in combination (e.g., as in a typical CVD process).

Figure 4:
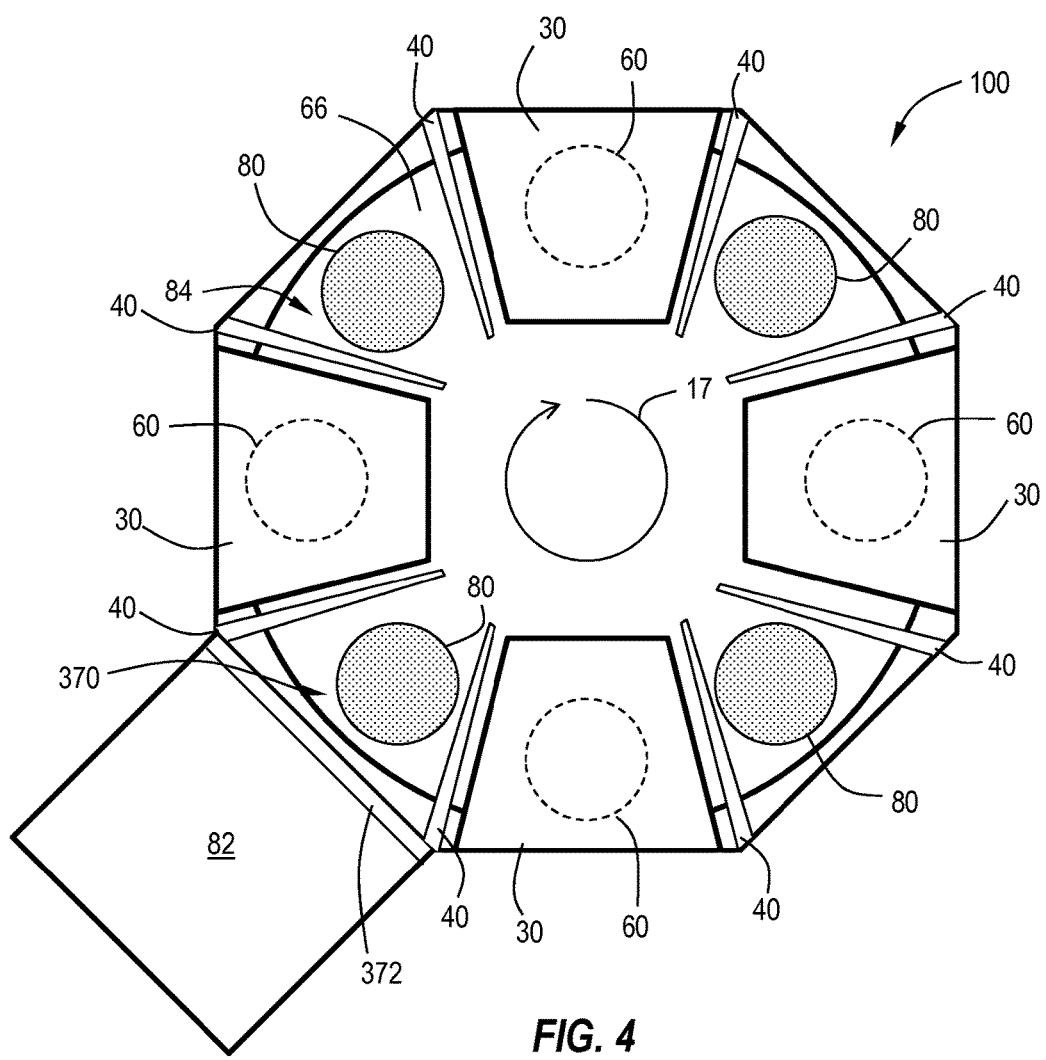
FIG. 4 is a schematic plan view of a substrate processing system configured with four gas distribution assembly units with a loading station in accordance with one or more embodiments of the invention.

Processing chambers having multiple gas injectors can be used to process multiple wafers simultaneously so that the wafers experience the same process flow. For example, as shown in FIG. 4, the processing chamber 100 has four gas gas distribution assemblies 30 and four substrates 60. At the outset of processing, the substrates 60 can be positioned between the gas distribution assemblies 30 (also referred to as injector assemblies). Rotating the susceptor 66 of the carousel by 45° will result in each substrate 60 being moved to a gas distribution assembly 30 for film deposition. This is the position shown in FIG. 4. An additional 45° rotation would move the substrates 60 away from the gas distribution assemblies 30. With spatial ALD injectors, a film is deposited on the wafer during movement of the wafer relative to the injector assembly. In some embodiments, the susceptor 66 is rotated so that the substrates 60 do not stop beneath the gas distribution assemblies 30. The number of substrates 60 and gas distribution assemblies 30 can be the same or different. In some embodiments, there is the same number of wafers being processed as there are gas distribution assemblies. In one or more embodiments, the number of wafers being processed are an integer multiple of the number of gas distribution assemblies. For example, if there are four gas distribution assemblies, there are 4x wafers being processed, where x is an integer value greater than or equal to one.

The processing chamber 100 shown in FIG. 4 is merely representative of one possible configuration and should not be taken as limiting the scope of the invention. Here, the processing chamber 100 includes a plurality of gas distribution assemblies 30. In the embodiment shown, there are four gas distribution assemblies 30 evenly spaced about the processing chamber 100. The processing chamber 100 shown is octagonal, however, it will be understood by those skilled in the art that this is one possible shape and should not be taken as limiting the scope of the invention. The gas distribution assemblies 30 shown are rectangular, but it will be understood by those skilled in the art that the gas distribution assemblies can be pie-shaped segments, like that shown in FIG. 3. Additionally, each segment can be configured to deliver gases in a spatial type arrangement with multiple different reactive gases flowing from the same segment or configured to deliver a single reactive gas or a mixture of reactive gases.

The processing chamber 100 includes a substrate support apparatus, shown as a round susceptor 66 or susceptor assembly. The substrate support apparatus, or susceptor 66, is capable of moving a plurality of substrates 60 beneath each of the gas distribution assemblies 30. A load lock 82 might be connected to a side of the processing chamber 100 to allow the substrates 60 to be loaded/unloaded from the chamber 100.

The processing chamber 100 may include a plurality, or set, of first treatment stations 80 positioned between any or each of the plurality of gas distribution assemblies 30. In some embodiments, each of the first treatment stations 80 provides the same treatment to a substrate 60.

The number of treatment stations and the number of different types of treatment stations can vary depending on the process. For example, there can be one, two, three, four, five, six, seven or more treatment stations positioned between the gas distribution assemblies 30. Each treatment stations can independently provide a different treatment from every other set of treatments station, or there can be a mixture of the same type and different types of treatments. In some embodiments, one or more of the individual treatments stations provides a different treatment than one or more of the other individual treatment stations.

Figure 5:
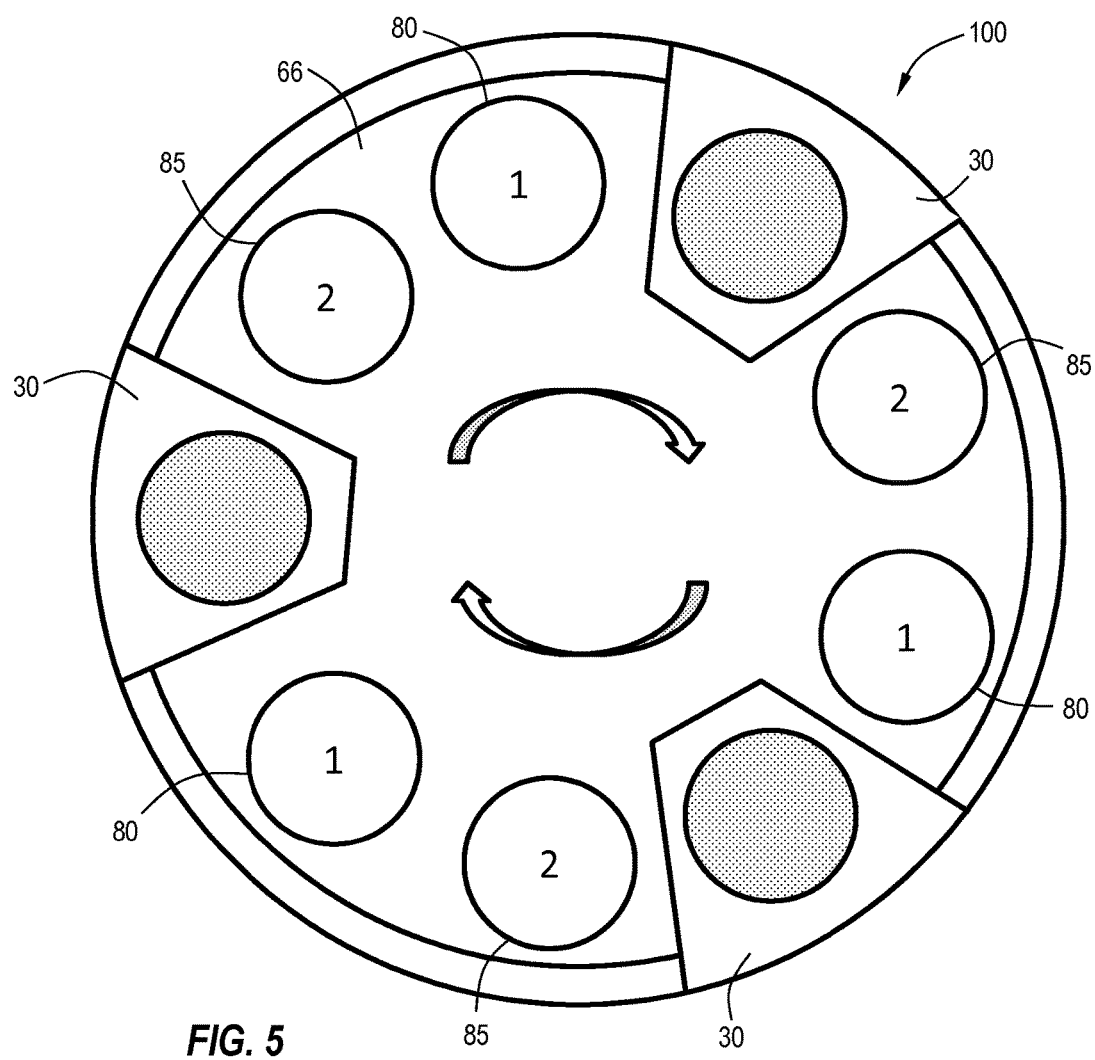
FIG. 5 is a schematic plan view of a substrate processing system configured with three gas distribution assembly units.

In the embodiment shown in FIG. 5, a set of second treatment stations 85 are positioned between the first treatment stations 80 and the gas distribution assemblies 30 so that a substrate 60 rotated through the processing chamber 100 would encounter, depending on where the substrate 60 starts, a gas distribution assembly 30, a first treatment station 80 and a second treatment station 85 before encountering a second of any of these. For example, as shown in FIG. 5, if the substrate started at the first treatment station 80, it would see, in order, the first treatment station 80, a gas distribution assembly 30 and a second treatment station 85 before encountering a second first treatment station 85.

Treatment stations can provide any suitable type of treatment to the substrate, film on the substrate or susceptor assembly. For example, UV lamps, flash lamps, plasma sources and heaters. The wafers are then moved between positions with the gas distribution assemblies 30 to a position with, for example, a showerhead delivering plasma to the wafer. The plasma station being referred to as a treatment station 80. In one or more example, silicon nitride films can be formed with plasma treatment after each deposition layer. As the ALD reaction is, theoretically, self-limiting as long as the surface is saturated, additional exposure to the deposition gas will not cause damage to the film.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where it can pause again. Pausing between the injectors may provide time for additional processing steps between each layer deposition (e.g., exposure to plasma).

In some embodiments, the processing chamber comprises a plurality of gas curtains 40. Each gas curtain 40 creates a barrier to prevent, or minimize, the movement of processing gases from the gas distribution assemblies 30 from migrating from the gas distribution assembly regions and gases from the treatment stations 80 from migrating from the treatment station regions. The gas curtain 40 can include any suitable combination of gas and vacuum streams which can isolate the individual processing sections from the adjacent sections. In some embodiments, the gas curtain 40 is a purge (or inert) gas stream. In one or more embodiments, the gas curtain 40 is a vacuum stream that removes gases from the processing chamber. In some embodiments, the gas curtain 40 is a combination of purge gas and vacuum streams so that there are, in order, a purge gas stream, a vacuum stream and a purge gas stream. In one or more embodiments, the gas curtain 40 is a combination of vacuum streams and purge gas streams so that there are, in order, a vacuum stream, a purge gas stream and a vacuum stream. The gas curtains 40 shown in FIG. 4 are positioned between each of the gas distribution assemblies 30 and treatment stations 80, but it will be understood that the curtains can be positioned at any point or points along the processing path.

Figure 6:
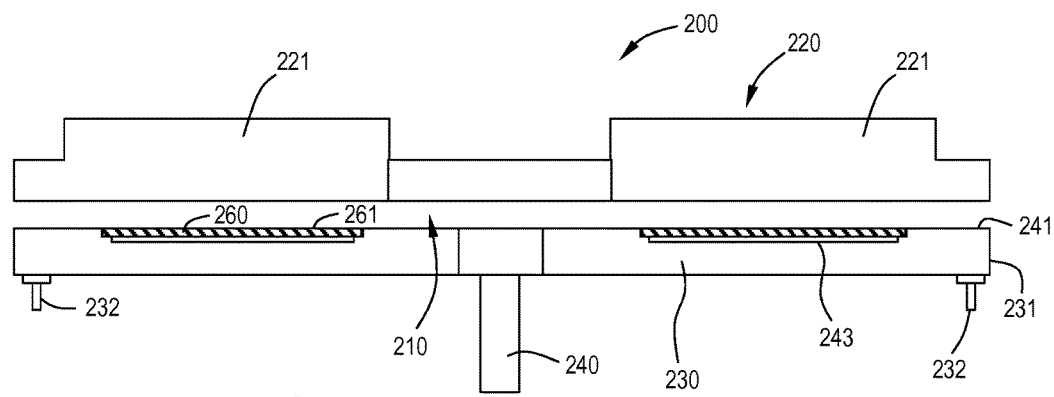
FIG. 6 shows a cross-sectional view of a processing chamber in accordance with one or more embodiments of the invention.

FIG. 6 shows an embodiment of a processing chamber 200 including a gas distribution assembly 220, also referred to as the injectors, and a susceptor assembly 230. In this embodiment, the susceptor assembly 230 is a rigid body. The rigid body of some embodiments has a droop tolerance no larger than 0.05 mm. Actuators 232 are placed, for example, at three locations at the outer diameter region of the susceptor assembly 230. As used in this specification and the appended claims, the terms "outer diameter" and "inner diameter" refer to regions near the outer peripheral edge and the inner edge, respectively. The outer diameter is not to a specific position at the extreme outer edge (e.g., near shaft 240) of the susceptor assembly 230, but is a region near the outer edge 231 of the susceptor assembly 230. This can be seen in FIG. 6 from the placement of the actuators 232. The number of actuators 232 can vary from one to any number that will fit within the physical space available. Some embodiments have two, three, four or five sets of actuators 232 positioned in the outer diameter region 231. As used in this specification and the appended claims, the term "actuator" refers to any single or multi-component mechanism which is capable of moving the susceptor assembly 230, or a portion of the susceptor assembly 230, toward or away from the gas distribution assembly 220. For example, actuators 232 can be used to ensure that the susceptor assembly 230 is substantially parallel to the injector assembly 220. As used in this specification and the appended claims, the term "substantially parallel" used in this regard means that the parallelism of the components does not vary by more than 5% relative to the distance between the components.

Once pressure is applied to the susceptor assembly 230 from the actuators 232, the susceptor assembly 230 can be levelled. As the pressure is applied by the actuators 232, the gap 210 distance can be set to be within the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The susceptor assembly 230 is positioned beneath the gas distribution assembly 220. The susceptor assembly 230 includes a top surface 241 and, optionally, at least one recess 243 in the top surface 241. The recess 243 can be any suitable shape and size depending on the shape and size of the wafers 260 being processed. In the embodiment shown, the recess 241 has a step region around the outer peripheral edge of the recess 241. The steps can be sized to support the outer peripheral edge of the wafer 260. The amount of the outer peripheral edge of the wafer 260 that is supported by the steps can vary depending on, for example, the thickness of the wafer and the presence of features already present on the back side of the wafer.

In some embodiments, as shown in FIG. 6, the recess 243 in the top surface 241 of the susceptor assembly 230 is sized so that a wafer 260 supported in the recess 243 has a top surface 261 substantially coplanar with the top surface 241 of the susceptor assembly 230. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 230 of FIG. 6 includes a support post 240 which is capable of lifting, lowering and rotating the susceptor assembly 230. The susceptor assembly 230 may include a heater, or gas lines, or electrical components within the center of the support post 240. The support post 240 may be the primary means of increasing or decreasing the gap between the susceptor assembly 230 and the gas distribution assembly 220, moving the susceptor assembly 230 into rough position. The actuators 232 can then make micro-adjustments to the position of the susceptor assembly to create the predetermined gap.

Figure 7:
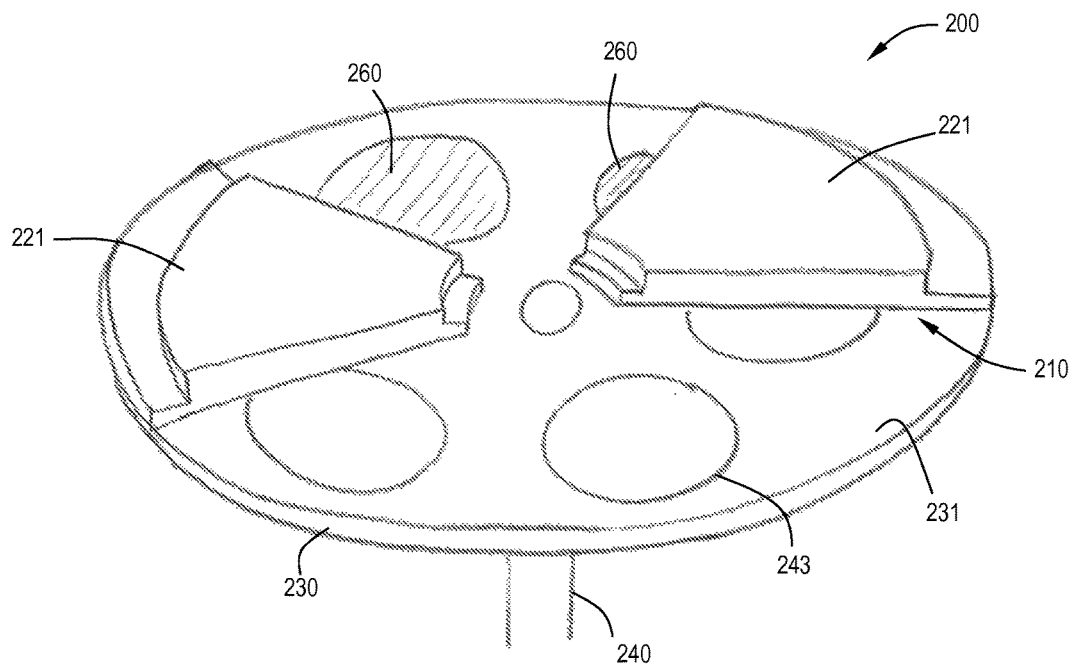
FIG. 7 shows a perspective view of a susceptor assembly and gas distribution assembly units in accordance with one or more embodiments of the invention.

The processing chamber 100 shown in FIG. 6 is a carousel-type chamber in which the susceptor assembly 230 can hold a plurality of wafers 260. The gas distribution assembly 220 may include a plurality of separate injector units 221, each injector unit 221 being capable of depositing a film or part of a film on the wafer 260, as the wafer is moved beneath the injector unit 221. FIG. 7 shows a perspective view of a carousel-type processing chamber 200. Two pie-shaped injector units 221 are shown positioned on approximately opposite sides of and above the susceptor assembly 230. This number of injector units 221 is shown for illustrative purposes only. It will be understood that more or less injector units 221 can be included. In some embodiments, there are a sufficient number of pie-shaped injector units 221 to form a shape conforming to the shape of the susceptor assembly 230. In some embodiments, each of the individual pie-shaped injector units 221 may be independently moved, removed and/or replaced without affecting any of the other injector units 221. For example, one segment may be raised to permit a robot to access the region between the susceptor assembly 230 and gas distribution assembly 220 to load/unload wafers 260.

Figure 8:
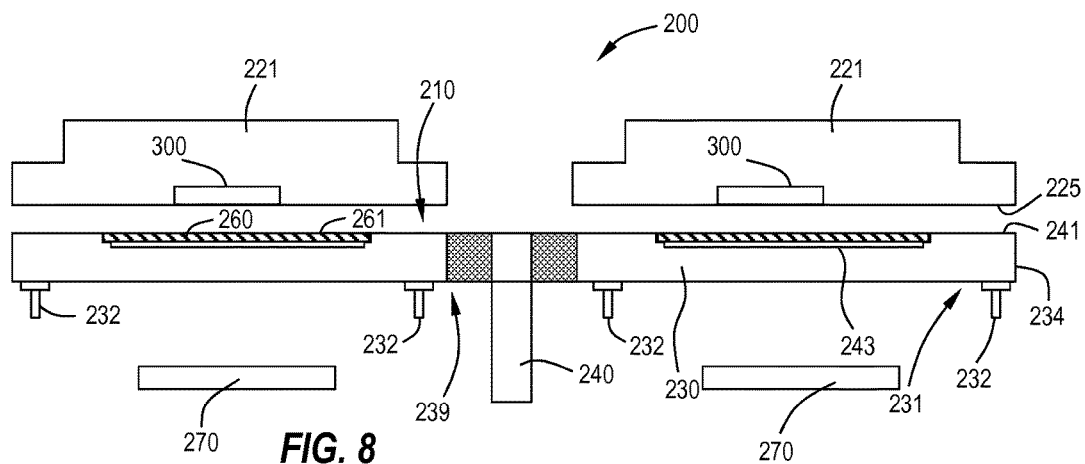
FIG. 8 shows a cross-sectional view of a processing chamber in accordance with one or more embodiments of the invention.

FIG. 8 shows another embodiment of the invention in which the susceptor assembly 230 is not a rigid body. In some embodiments, the susceptor assembly 230 has a droop tolerance of not more than about 0.1 mm, or not more than about 0.05 mm, or not more than about 0.025 mm, or not more than about 0.01 mm. Here, there are actuators 232 placed at the outer diameter region 231 and at the inner diameter region 239 of the susceptor assembly 230. The actuators 232 can be positioned at any suitable number of places around the inner and outer periphery of the susceptor assembly 230. In some embodiments, the actuators 232 are placed at three locations at both the outer diameter region 231 and the inner diameter region 239. The actuators 232 at both the outer diameter region 231 and the inner diameter region 239 apply pressure to the susceptor assembly 230.

Figure 9:
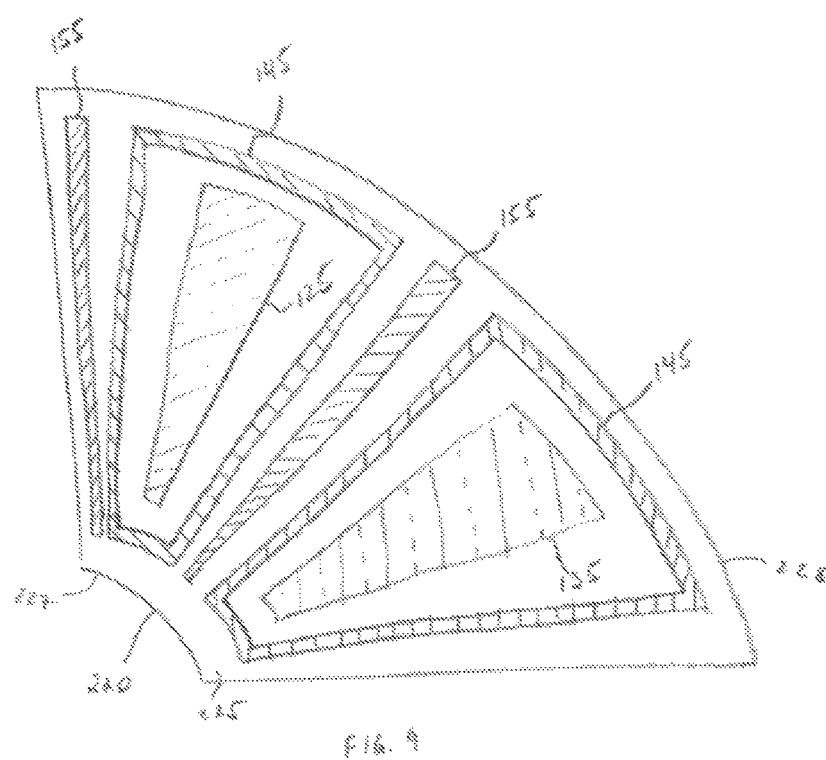
FIG. 9 shows a schematic of a pie-shaped gas distribution assembly in accordance with one or more embodiments of the invention.

FIG. 9 shows a sector or portion of a gas distribution assembly 220. The gas distribution assembly may comprise a plurality of sectors with each sector being identical or different. The sector shown may also be referred to as a circular gas distribution assembly and it will be understood that the circular gas distribution assembly is made of up of combination of the sectors shown. The circular gas distribution assembly 220 is positioned within the processing chamber and comprises a plurality of elongate gas ports 125, 135, 145 in a front face 225 of the gas distribution assembly 220. The plurality of elongate gas ports 125, 135, 145 extend from an area adjacent the inner peripheral edge 227 toward an area adjacent the outer peripheral edge 228 of the gas distribution assembly 220. The plurality of gas ports shown in FIG. 9 include a first reactive gas port 125, a second reactive gas port 135, a purge gas port 145 which surrounds each of the first reactive gas ports and the second reactive gas ports and vacuum ports 155.

Figure 10:
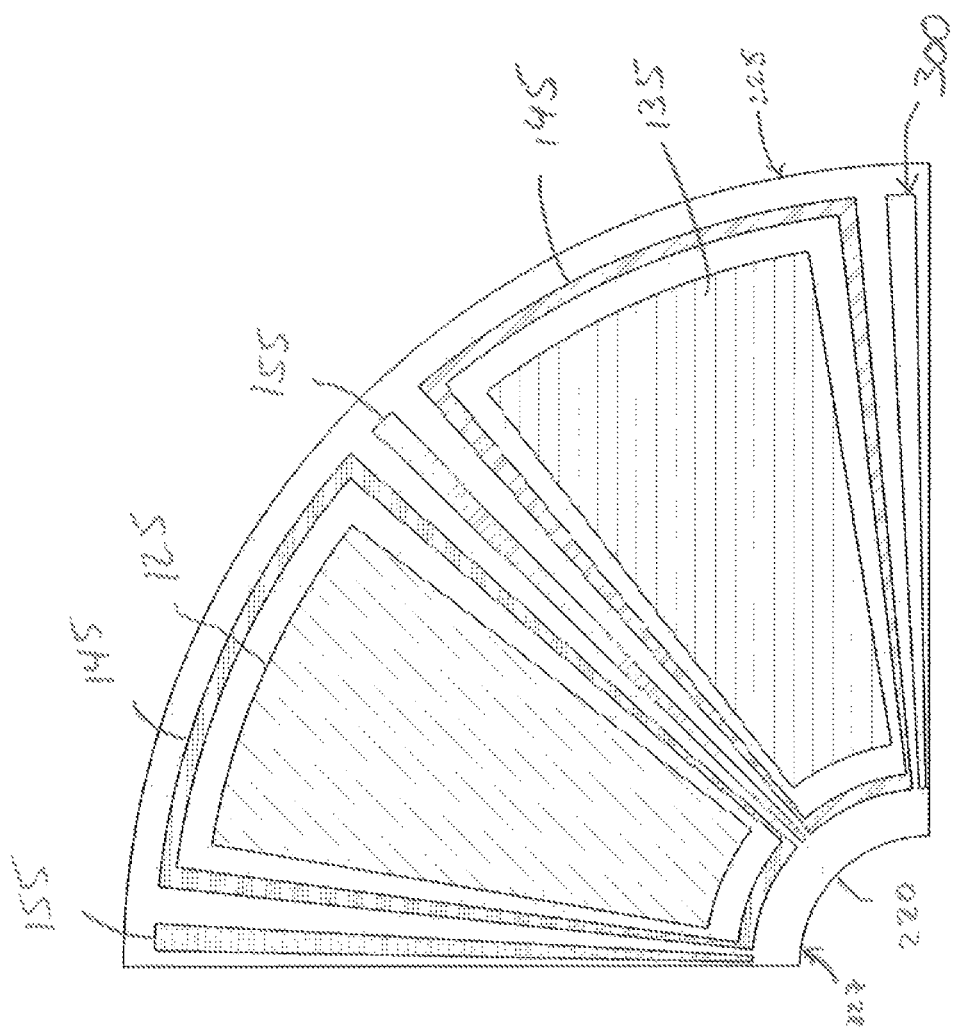
FIG. 10 shows a schematic of a pie-shaped gas distribution assembly in accordance with one or more embodiments of the invention.

The elongate gas ports 125, 135, 145 extend from at least about an inner diameter region 227 to an outer diameter region 228 of the gas distribution assembly. With reference to the embodiments shown in FIG. 9 or 10, when stating that the ports extend from at least about an inner diameter region to at least about an outer diameter region, it will be understood that the ports can extend more than just radially from inner to outer regions. The ports can extend tangentially as vacuum port 145 surrounds reactive gas port 125 and reactive gas port 135. In the embodiment shown in FIGS. 9 and 10, the wedge shaped reactive gas ports 125, 135 are surrounded on all edges, including adjacent the inner peripheral region and outer peripheral region, by a vacuum port 145.

With reference to FIGS. 10-16 some embodiments of the processing chamber include a heating module 300 within the gas distribution assembly 220. The heating module 300 comprises a housing 310, a heating source 320 and power source 330 with power connections 331, 332. The shape of the housing 310 can vary depending on the use. In some embodiments, as shown, the heating module 300 has a wedge shape (shown in FIG. 11) or is part of a wedge shaped segment of the gas distribution assembly (shown in FIG. 10).

Figure 11:
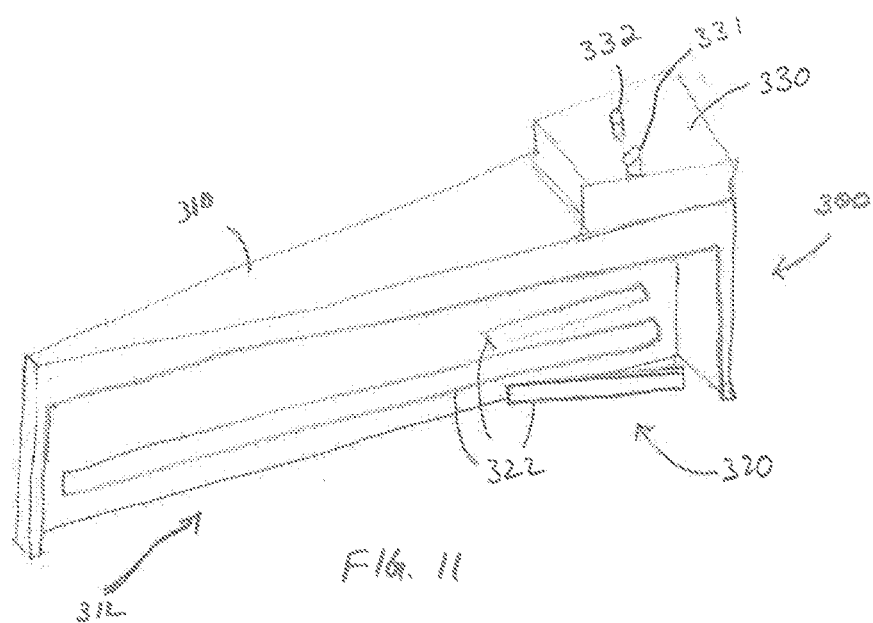
FIG. 11 shows a cross-sectional perspective view of a heating module in accordance with one or more embodiments of the invention.
Figure 12:
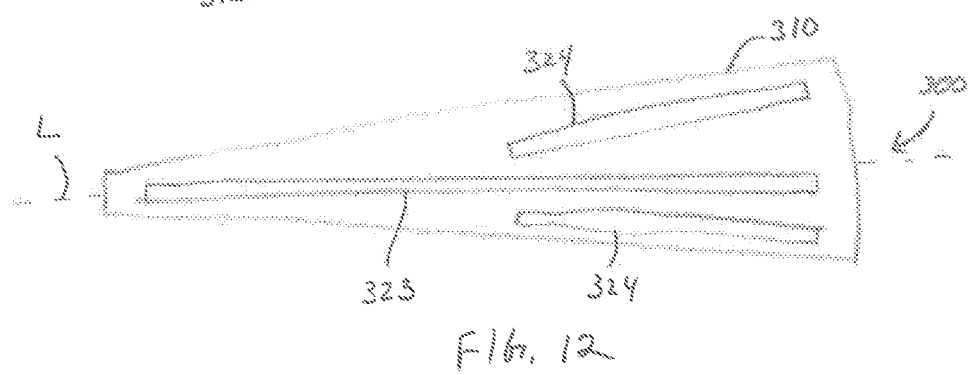
FIG. 12 shows a front view of a heating module in accordance with one or more embodiments of the invention.

The heating source 320 within the heating module 300 can be any suitable heating source, including by not limited to, lamps and resistive heaters. Lamps 322 can be any suitable shape, for example, straight lamps as shown in FIG. 11. The number of lamps 322 can be varied depending on, for example, the shape or size of the housing 310 and the power requirements. Additionally, the lamps 322 can have various output power depending and may include lamps 322 of different power in the same housing 310. For example, as shown in FIG. 12, a wedge shaped housing 300 might have a high power lamp 323 extending along the middle of the long axis L of the housing 310 and lower power lamps 324 near the wide end of the housing 310.

Some embodiments have a heating source 320, also referred to as a radiant lamp module, comprising a single or plurality of lamps that emit radiant energy toward the susceptor. Without being bound by any particular theory of operation, it is believed that the radiant lamp module can be used to provide enough power to counteract the loss in temperature between the heated susceptor and the cooler gas distribution assembly. In one or more embodiments, the lamp module delivers a maximum of 10 kW, or 9 kW, or 8 kW, or 7 kW, or 6 kW, or 5 kW of 4 kW to the susceptor.

In some embodiments, the heat source comprises at least one lamp to direct radiant energy toward the top surface of the susceptor assembly. In the embodiment shown in FIGS. 11 and 12, the heat source 320 comprises three lamps, a long lamp along the middle portion of the housing and two short lamps on either side of the long lamp. The short lamps are located on the wider portion of the wedge shaped housing.

The embodiment shown in FIG. 11 provides a heating source 320 with at least one lamp 322 with a substantially unobstructed path to the top surface of the susceptor assembly, positioned beneath the open 312 of the housing 310. As used in this specification and the appended claims, the term "substantially unobstructed" means that the light emitted by the at least one lamp in the direction perpendicular to the surface of the susceptor assembly is unobstructed. The heating module 300 shown in FIG. 11 is exemplary of a heating module that can be used to heat the surface of the susceptor.

Figure 13:
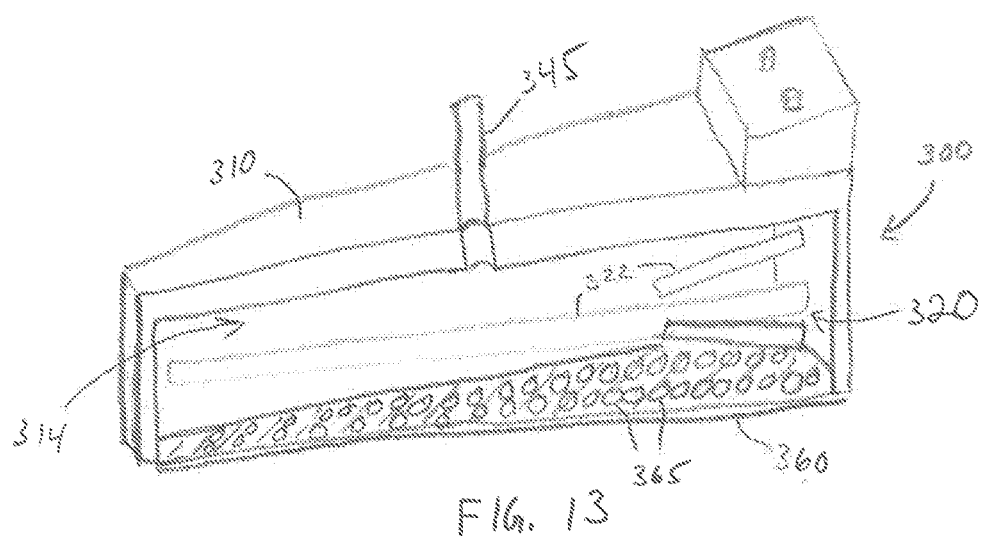
FIG. 13 shows a cross-sectional perspective view of a heating module in accordance with one or more embodiments of the invention.

In the embodiment shown in FIG. 13, the heating module 300 can be incorporated into a gas port. A gas source (not shown) is connected to an inlet 345 on the housing 310. Gas flowing through this inlet 345 can pass around or to the side of the at least one lamp 322. The embodiment shown in FIG. 11 is exemplary of a heating module positioned in a purge gas port so that the heating module 300 both heats the susceptor assembly and acts as a purge gas port.

Figure 14:
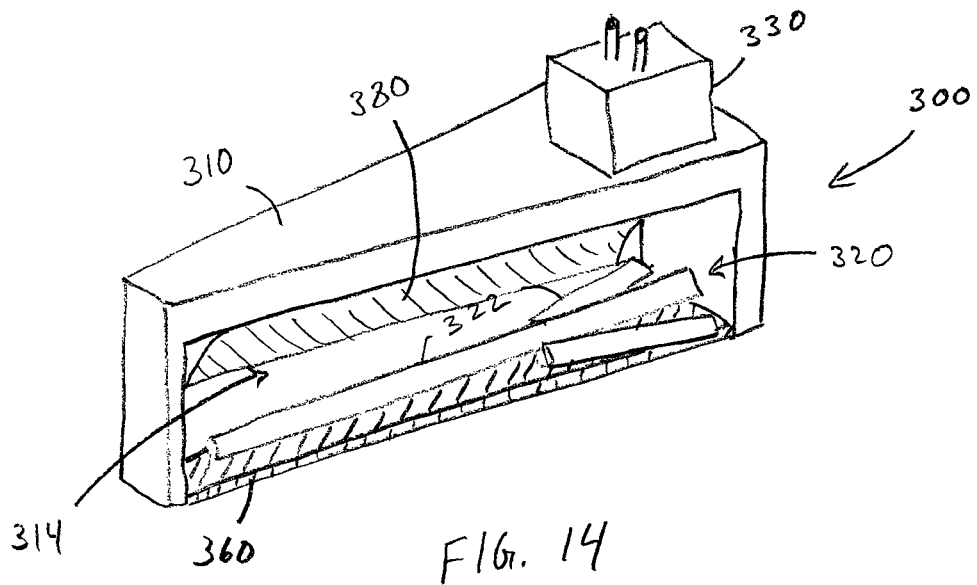
FIG. 14 shows a cross-sectional perspective view of a heating module in accordance with one or more embodiments of the invention.

The embodiment shown in FIG. 14 has a heating module 300 which includes a diffusion plate 360 that is positioned between the heat source 320 and the top surface of the susceptor (not shown). The diffusion plate 360 can be a solid shield (as shown in FIG. 14) which does not allow gas to pass between an inner region 314 of the housing 310 and the processing region located between the susceptor assembly and the gas distribution assembly. Embodiments of this sort are exemplary of a heating module 300 which heats the susceptor assembly by heating the diffusion plate 360 and subsequently heating the susceptor assembly by proximity. The heat source 320 in this type of embodiment can be either radiative (e.g., lamps, shown in FIG. 14) or resistive (e.g., a tungsten wire, shown in FIG. 15).

The diffusion plate can be made of any suitable material including, but not limited to, silicon carbide, aluminum nitride, aluminum and stainless steel. In some embodiments, the diffusion plate comprises silicon carbide.

Figure 15:
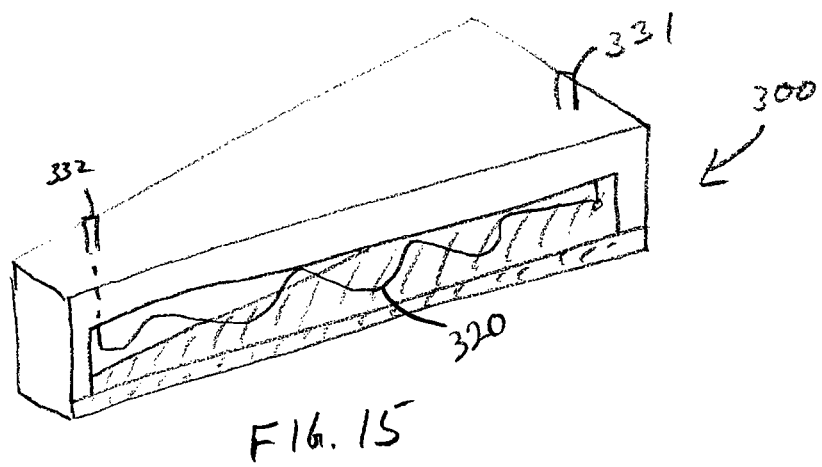
FIG. 15 shows a cross-sectional perspective view of a heating module in accordance with one or more embodiments of the invention.

The heating module 300 of the embodiment shown in FIGS. 14 and 15 is exemplary of a heating module 300 that is used to heat the susceptor assembly or to serve as a pre-heat section of the gas distribution assembly. In some embodiments, a heating module 300 with a solid diffusion plate 360 can be incorporated into any portion of the gas distribution assembly. For example, the heating module 300 can be incorporated into one or multiple positions between the various reactive gas ports, purge gas ports and vacuum ports.

Referring again to FIG. 4, in some embodiments, the heating module may be positioned at a loading area 370 of the processing chamber 100. The loading area 370 is a region in the processing chamber 100 adjacent a slit valve 372, or other isolation mechanism, through which processed and unprocessed wafers pass. The heating module 300 can be positioned at the same location as, or in place of, the treatment station 80 adjacent the loading area 370. As a pre-heating module, the heating module 300 can be turned on or off as wafers are passed through the slit valve 372.

In some embodiments, the heat source 320 of the pre-heating module is turned on as an unprocessed wafer is loaded into the processing chamber and onto the susceptor 66. The pre-heating module can be used to minimize or eliminate thermal shock which might be experienced by the wafer as it contacts the heated susceptor. The pre-heating module can then be turned off to unload the wafer after it has been processed.

In some embodiments, the heating module 300 positioned adjacent the loading area 370 is turned on to a first power level to preheat an unprocessed wafer as it enters the chamber. After all wafers have been loaded into the chamber, the heat source 320 power can be changed to provide a lower or greater amount of heat to help minimize the temperature drop between the susceptor 66 and the gas distribution assembly during processing of the wafers. After the wafers have been processed, the heat source 320 power can be turned off to unload the wafers.

Referring again to FIG. 13, in some embodiments, the diffusion plate 360 comprises a plurality of spaced apertures 365. The spaced apertures 365 can be used to allow a gas to pass through the diffusion plate 360. The heating module 300 can be incorporated into a gas port so that gas passes through the heating module 300 and diffuses through the plurality of apertures 365 in the diffusion plate 360. It will be understood that while the embodiment shown in FIG. 13 includes a diffusion plate 360 with a plurality of spaced apertures 365, the diffusion plate can be omitted.

In one or more embodiments, as shown in FIG. 8, the processing chamber includes a heater 270, or plurality of heaters, located beneath the susceptor assembly 230 to heat the susceptor assembly 230 and a heating module 300 within the gas distribution assembly 220 to minimize power loss between the susceptor assembly 230 and the gas distribution assembly 220.

In some embodiments, the heating module 300 is used as a direct heat source instead of the heater 270 located beneath the susceptor. The heater 270 heats the wafers indirectly; the heater 270 heats the susceptor which heats the substrate through contact. For a heating module which uses a lamp as the heating source, light can be directed onto the surface of the susceptor assembly and wafers. This allows for direct heating of the wafer surface or a layer on the wafer surface without heating the susceptor.

In some embodiments, the heating module 300 is used as in addition to the heater 270. Thus, the susceptor is heated from both the top and bottom at the same time which might result in a more uniform temperature distribution across the susceptor and more uniform heating the wafers. Additionally, the heating module 300 is able to directly heat the surface of the wafer which is being processed.

In some embodiments, as shown in FIG. 14, the heating module 300 further comprises a reflector 380 to direct radiant energy from the heat source 320 toward the susceptor assembly. The reflector 380 can be made of any suitable material including, but not limited to, silver and gold. The reflector 380 can be made up of more than one layer of material. For example, the reflector may include a substrate which the reflector is applied to, diffusion barriers and/or adhesion layers.

Figure 16:
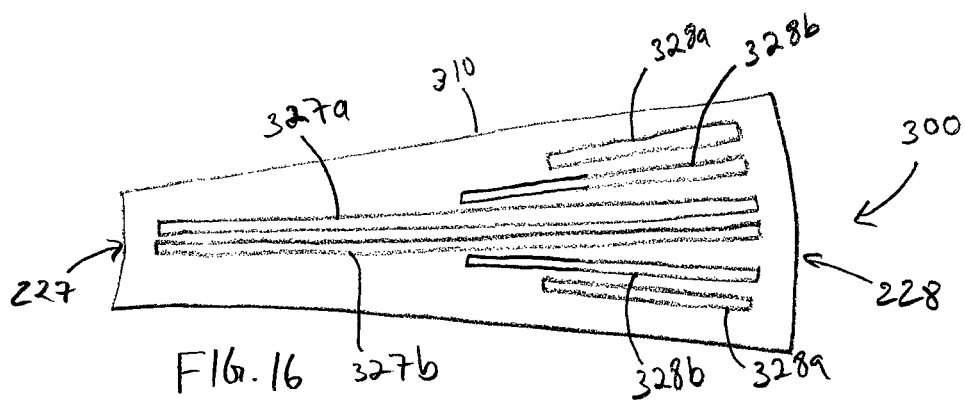
FIG. 16 shows a front view of a heating module in accordance with one or more embodiments of the invention.

FIG. 16 shows another embodiment of a heating module 300 in which there is a plurality of lamps: long lamps 327a, 327b, medium length lamps 328b and short lamps 328a. As used in this specification and the appended claims, the terms "long", "medium" and "short" used in this respect refer to the relative length of the lamp. A "long" lamp may have a length that is greater than or equal to about 50% or 60% or 70% of the length defined by the distance between the inner peripheral edge 227 and outer peripheral edge 228. A "short" lamp may have a length that is less than or equal to about 50% or 40% or 30% of the length defined by the distance between the inner peripheral edge 227 and the outer peripheral edge 228. A "medium" lamp may have a length that is in the range of about 30% to about 70%, or in the range of about 40% to about 60% of the length defined by the distance between the inner peripheral edge 227 and the outer peripheral edge 228. The long lamp 327a, medium lamp 328b and short lamps 328a may be of a similar power output or differing power outputs. The position and order of the lamps is merely one possible configuration and should not be taken as limiting the scope of the disclosure.

In one or more embodiment, the heating module 300 shown in FIG. 16 is positioned as a pre-heating module adjacent the loading area of the processing chamber. In use, while loading an unprocess wafer, lamps 327a, 328a may be turned on to pre-heat the wafer. Lamps 327b, 328b can be on or off at this point. Once the wafer has been pre-heated and is ready for processing, lamps 327a, 328a can be turned off and lamps 327b, 328b are turned on, if not already on, to provide heat to the susceptor to counteract the heat loss observed.

In some embodiments, all of the lamp 327a, 327b, 328a, 328b of FIG. 16 can have the same or similar power outputs. In use, all of the lamps may be turned on during loading of an unprocessed wafer. After loading, some of the lamps can be turned off to decrease the total power output during processing.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the predetermined separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present invention, other and further embodiments of the invention may be devised without departing from the basic scope thereof, and the scope thereof is determined by the claims that follow.

What is claimed is:

1. A processing chamber comprising:
a circular gas distribution assembly positioned within the processing chamber, the gas distribution assembly comprising a plurality of sectors in a front face of the gas distribution assembly, each sector comprising a plurality of elongate gas ports, a heating module, or a combination thereof such that the gas distribution assembly comprises at least one sector wherein a heating module is incorporated into a gas port so that a gas passes through the heating module, the plurality of elongate gas ports extending at least from an inner diameter region to an outer diameter region of the gas distribution assembly, the plurality of gas ports comprising a reactive gas port to deliver a reactive gas to the processing chamber, a purge gas port to deliver a purge gas to the processing chamber and a vacuum port to evacuate gases from the processing chamber, the heating module comprising a heat source, the heat source comprising one or more of a lamp or a resistive heater;
a susceptor assembly within the processing chamber to rotate at least one substrate in a substantially circular path about a rotational axis, the susceptor assembly having a top surface defined by an inner diameter region and an outer diameter region, the susceptor assembly positioned below the gas distribution assembly so that the top surface of the susceptor assembly faces the front face of the gas distribution assembly; and
a heater located beneath the susceptor assembly to heat the susceptor assembly, the heater comprising one or more of a lamp or a resistive heater,
wherein the heating module heats the gas and emits radiant energy toward the top surface of the susceptor assembly to counteract a loss in temperature between the susceptor assembly and the gas distribution assembly,
wherein the heating module comprises a first heat source extending from the inner diameter region to the outer diameter region and a second heat source near the outer diameter region.

2. The processing chamber of claim 1, wherein the heat source comprises at least one lamp to direct radiant energy toward the top surface of the susceptor assembly.

3. The processing chamber of claim 2, wherein the at least one lamp has a substantially unobstructed path to the top surface of the susceptor assembly.

4. The processing chamber of claim 1, wherein the heating module further comprises a diffusion plate between the heat source and the top surface of the susceptor.

5. The processing chamber of claim 4, wherein the diffusion plate comprises SiC.

6. The processing chamber of claim 4, wherein the diffusion plate comprises a plurality of spaced apertures and gas diffuses through the plurality of apertures in the diffusion plate.

7. The processing chamber of claim 1, wherein the heating module is positioned at a loading area of the processing chamber.

8. The processing chamber of claim 1, wherein the heating module further comprises a reflector to direct radiant energy from the heat source toward the susceptor assembly.

9. The processing chamber of claim 1, wherein the heating module comprises at least two second heat sources.

10. A processing chamber comprising:
a slit valve to isolate an interior region of the processing chamber;
a circular gas distribution assembly positioned within the processing chamber, the circular gas distribution assembly comprising a plurality of sectors in a front face of the gas distribution assembly, each sector comprising a plurality of elongate wedge shaped gas ports, a wedge shaped heating module, or a combination thereof, such that the gas distribution assembly comprises at least one sector wherein a wedge shaped heating module is incorporated within a gas port so that a gas passes through the heating module, the plurality of elongate wedge shaped gas ports extending at least from an inner diameter region to an outer diameter region of the gas distribution assembly, the plurality of elongate wedge shaped gas ports comprising at least one reactive gas port to deliver at least one reactive gas to the processing chamber, at least one purge gas port to deliver a purge gas to the processing chamber and at least one vacuum port to evacuate gases from the processing chamber, and the wedge shaped heating module comprising a heat source, the heating module located adjacent the slit valve, the heat source comprising one or more of a lamp or a resistive heater;
a susceptor assembly within the processing chamber to rotate at least one substrate in a substantially circular path about a rotational axis, the susceptor assembly having a top surface defined by an inner diameter region and an outer diameter region, the susceptor assembly positioned below the gas distribution assembly so that the top surface of the susceptor assembly faces the front face of the gas distribution assembly; and
a heater located beneath the susceptor assembly to heat the susceptor assembly, the heater comprising one or more of a lamp or a resistive heater,
wherein the heating module heats the gas and emits radiant energy toward the top surface of the susceptor assembly to counteract a loss in temperature between the susceptor assembly and the gas distribution assembly,
wherein the heating module comprises a first heat source extending from the inner diameter region to the outer diameter region and a second heat source near the outer diameter region.

11. The processing chamber of claim 10, wherein the heat source comprises at least one lamp to direct radiant energy toward the top surface of a wafer entering the processing chamber through the slit valve.

12. The processing chamber of claim 11, wherein the at least one lamp has a substantially unobstructed path to the top surface of the wafer.

13. The processing chamber of claim 10, wherein the heating module further comprises a diffusion plate between the heat source and the top surface of the susceptor, the diffusion plate comprising SiC.

14. The processing chamber of claim 10, wherein the heating module comprises at least two second heat sources.

15. A processing chamber comprising:
a circular gas distribution assembly positioned within the processing chamber, the circular gas distribution assembly comprising a plurality of sectors in a front face of the gas distribution assembly, each sector comprising one or more of a plurality of elongate wedge shaped gas ports, a wedge shaped heating module or both such that the gas distribution assembly comprises at least one sector wherein a heating module is incorporated into a gas port so that a gas passes through the heating module, the plurality of elongate wedge shaped gas ports extending at least from an inner diameter region to an outer diameter region of the gas distribution assembly, the plurality of elongate wedge shaped gas ports comprising at least one reactive gas port to deliver at least one reactive gas to the processing chamber, at least one purge gas port to deliver a purge gas to the processing chamber, at least one vacuum port to evacuate gases from the processing chamber, and the wedge shaped heating module consisting of at least one lamp;

a susceptor assembly within the processing chamber to rotate at least one substrate in a substantially circular path about a rotational axis, the susceptor assembly having a top surface defined by an inner diameter region and an outer diameter region, the susceptor assembly positioned below the gas distribution assembly so that the top surface of the susceptor assembly faces the front face of the gas distribution assembly; and a heater located beneath the susceptor assembly to heat the susceptor assembly, the heater comprising one or more of a lamp or a resistive heater, wherein the heating module heats the gas and emits radiant energy toward the top surface of the susceptor assembly to counteract a loss in temperature between the susceptor assembly and the gas distribution assembly, wherein the heating module comprises a first lamp extending from the inner diameter region to the outer diameter region and at least two second lamps near the outer diameter region.

16. The processing chamber of claim 15, wherein the heating module further comprises a reflector to direct radiant energy from the at least one lamp toward the susceptor assembly.

17. The processing chamber of claim 15, wherein the heating module further comprises a diffusion plate positioned at a front face of the gas distribution assembly, the diffusion plate optionally comprising a plurality of spaced apertures.

* * * * *